(12) United States Patent
Suda

(10) Patent No.: US 6,980,248 B1
(45) Date of Patent: Dec. 27, 2005

(54) IMAGE PICKUP APPARATUS

(75) Inventor: Yasuo Suda, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 957 days.

(21) Appl. No.: 09/604,744

(22) Filed: Jun. 28, 2000

(30) Foreign Application Priority Data

Jun. 30, 1999 (JP) .......................................... 11-185660

(51) Int. Cl.[7] .............................................. H04N 5/225
(52) U.S. Cl. .......................... 348/335; 348/42; 348/340
(58) Field of Search ................................ 348/373, 335, 348/218.1, 340, 211, 211.1, 362, 273; 358/362

(56) References Cited

U.S. PATENT DOCUMENTS

| | | | |
|---|---|---|---|
| 3,304,435 A | 2/1967 | Norwood | 250/237 |
| 4,028,725 A | 6/1977 | Lewis | 348/115 |
| 4,724,354 A | 2/1988 | Dill | 313/371 |
| 4,790,632 A | 12/1988 | Miyakawa | 349/95 |
| 4,873,572 A * | 10/1989 | Miyazaki et al. | 348/45 |
| 4,920,395 A | 4/1990 | Muro | 357/30 |
| 5,255,088 A * | 10/1993 | Thompson | 348/90 |
| 5,262,819 A | 11/1993 | Ohtaka et al. | 354/402 |
| 5,565,914 A * | 10/1996 | Motta | 348/294 |
| 5,587,820 A * | 12/1996 | May et al. | 349/116 |
| 5,694,165 A | 12/1997 | Yamazaki et al. | 348/218 |
| 5,864,364 A | 1/1999 | Ohyama et al. | 348/211 |
| 6,157,420 A * | 12/2000 | Nakanishi et al. | 349/9 |
| 6,388,709 B1 | 5/2002 | Kobayashi | 348/362 |
| 6,560,018 B1 | 5/2003 | Swanson | 359/569 |

FOREIGN PATENT DOCUMENTS

| | | | | |
|---|---|---|---|---|
| EP | 0 660 421 A3 | 6/1995 | | |
| EP | 0 660 421 A2 | 6/1995 | | |
| EP | 0773673 | 5/1997 | .......... | H04N/5/335 |
| EP | 0840502 | 5/1998 | .......... | H04N/5/225 |
| EP | 0 896 480 | 2/1999 | | |
| JP | 60-241277 | 11/1985 | | |
| JP | 61-16580 | 1/1986 | | |
| JP | 1-150372 | 6/1989 | | |
| JP | 01-248542 | 10/1989 | | |
| JP | 03-286566 | 12/1991 | | |
| JP | 7-84177 | 3/1995 | .......... | G02F/7/28 |
| JP | 7-123418 | 5/1995 | .......... | H04N/9/04 |
| JP | 9-172649 | 6/1997 | .......... | H04N/9/97 |
| JP | 9-284617 | 10/1997 | .......... | H04N/5/225 |
| JP | 10-145802 | 10/1997 | .......... | H04N/9/07 |
| WO | WO 93/11631 | 6/1993 | | |
| WO | WO93/11631 | * 6/1993 | .......... | H04N/5/335 |

OTHER PUBLICATIONS

"Kogaku Gijutsu Handbook Zohoban (Handbook of Optical Technology, Enlarged Edition)" (1975, Asakura Shoten).
European Search Report dated Oct. 15, 2002 (Ref. No. 2728230).
European Search Report dated Mar. 25, 2004 (Ref. No. 2711330).
European Search Report dated Mar. 11, 2004 (Ref. No. 2728330).

* cited by examiner

Primary Examiner—Tuan Ho
Assistant Examiner—Gevell Selby
(74) Attorney, Agent, or Firm—Fitzpatrick, Cella, Harper & Scinto

(57) ABSTRACT

An image pickup apparatus comprising first and second image pickup portions for receiving at least a first wavelength component of an object light and a second wavelength component of the object light different from the first wavelength component, respectively, a first optical system for projecting the object light onto the first image pickup portion, a second optical system for projecting the object light onto the first and second image pickup portions via an optical path different from that of the first optical system, and a guide path forming portion for forming a guide path for receiving the object light projected by the first optical system and guiding the received object light to the first image pickup portion, and for receiving the object light projected by the second optical system onto the first image pickup portion and not guiding the object light to the first image pickup portion.

20 Claims, 11 Drawing Sheets

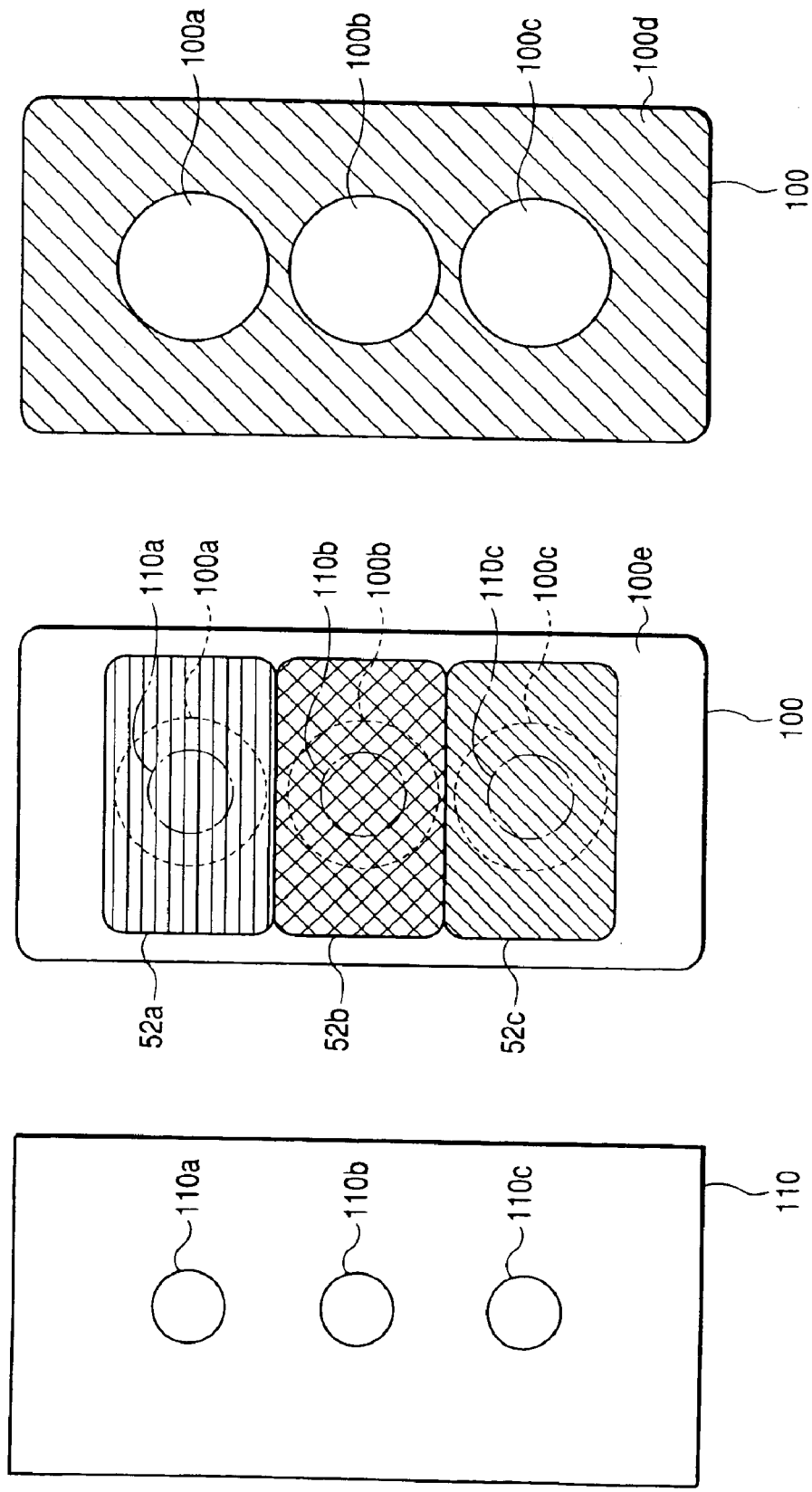

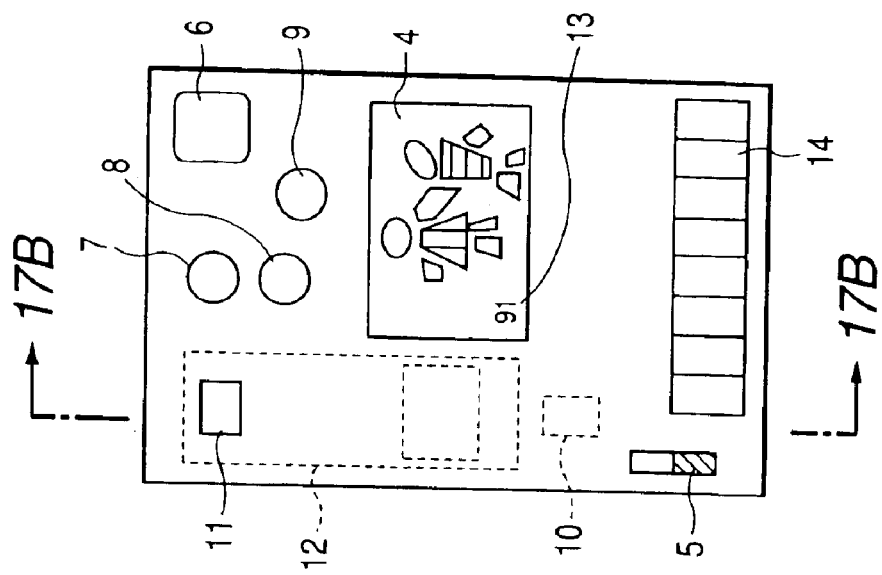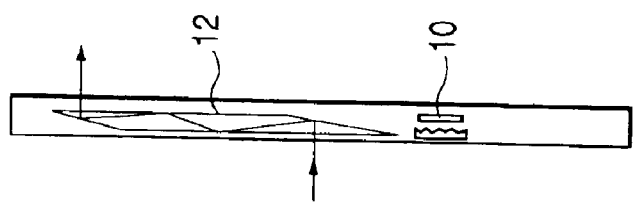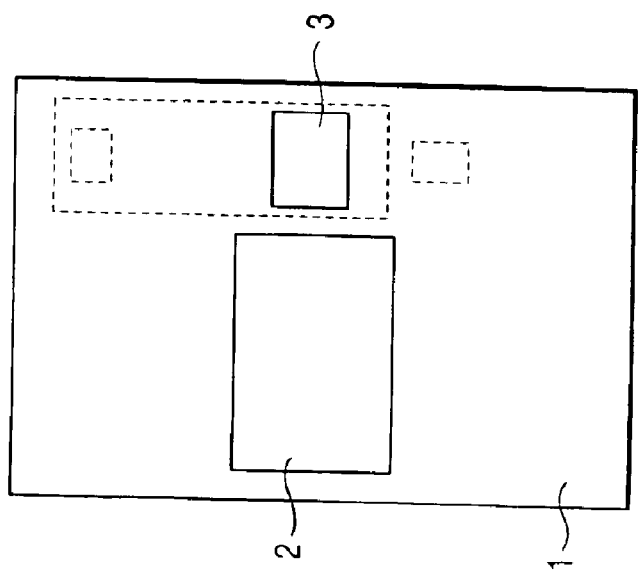

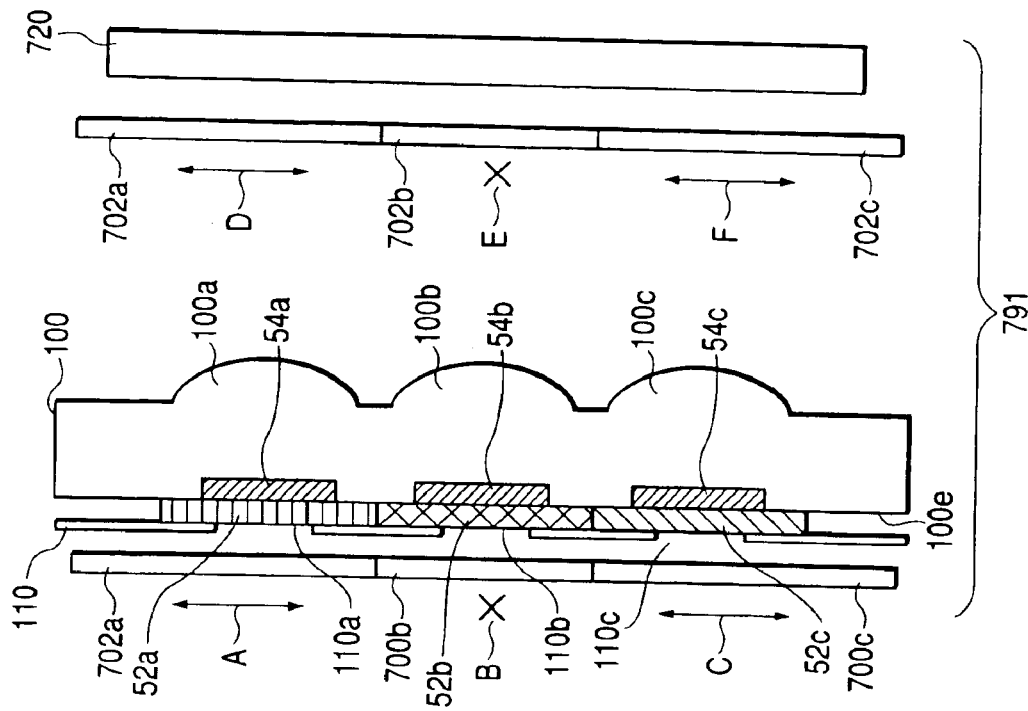
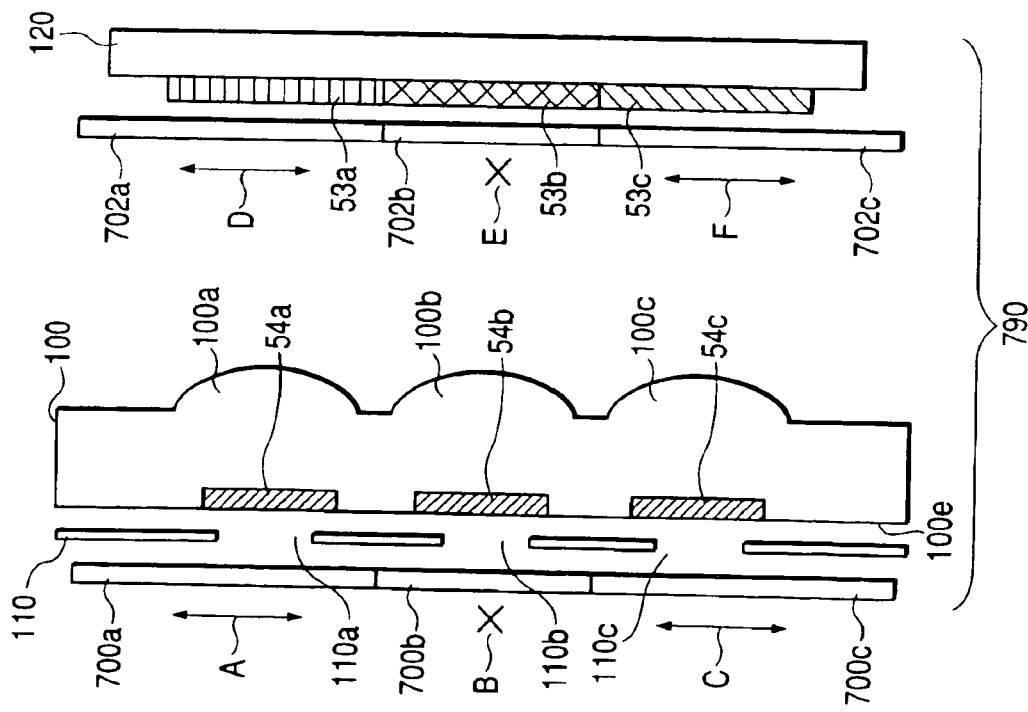

IMAGE PICKUP APPARATUS

BACKGROUND OF THE INVENTION

1. Field of the Invention

The present invention relates to an image pickup apparatus capable of picking up a dynamic image or a still image, such as a video camera.

2. Related Background Art

In a digital color camera, in response to depression of a RELEASE button, an image in a field is exposed onto a solid-state image pickup element, such as a CCD or a CMOS sensor, for a desired time period, and an image signal obtained therefrom, representing a still image of a picture, is converted into a digital signal and is subjected to predetermined processing, such as YC processing, whereby an image signal of a predetermined format is obtained. A digital image signal representing the picked-up image is recorded in a semiconductor memory on a single picture (frame-by-frame) basis. The recorded image signal is read as required, so as to reproduce a signal capable of being displayed or printed, and is output to a monitor or the like to be displayed.

One example of a technology for reducing the thickness of a digital color camera is disclosed in Japanese Patent Application Laid-open No. 10-145802. In Japanese Patent Application Laid-open No. 10-145802, an image pickup screen is divided into a plurality of regions, and an imaging optical system is provided for each of the regions so as to form a partial image of an object. In this case, one object image is formed by one imaging optical system, and object image, the number of which corresponds to the number of the divisions of the image pickup screen, are projected onto a single image pickup element. In addition, object image separating walls, referred to as visual field limit baffles, are provided. The visual field limit baffles are disposed between the imaging optical systems and the image pickup element, and function as walls for preventing light from adjacent imaging optical systems from leaking in.

Since the visual field limit baffles are partitions in image pickup regions, the more image pickup regions are segmentized, the more area that is necessary for the visual field limit baffles. This is an obstacle to miniaturization of the image pickup element. It lowers the production yield so as to make the overall area of the image pickup element extremely large, and, due to limitation on the cost, a practical upper limit is placed on the size of the image pickup element.

SUMMARY OF THE INVENTION

According to one aspect of the present invention, there is provided an image pickup apparatus comprising first and second image pickup portions for receiving at least a first wavelength component of an object light and a second wavelength component of the object light different from the first wavelength component, respectively, a first optical system for projecting the object light onto the first image pickup portion, a second optical system for projecting the object light onto the first and second image pickup portions via an optical path different from that of the first optical system, and a guide path forming portion for forming a guide path which receives the object light projected by the first optical system and guides the received object light to the first image pickup portion and for receiving the object light projected by the second optical system onto the first image pickup portion and not guiding the received object light to the first image pickup portion. The image pickup apparatus of the present invention does not require an object image separating wall, and can realize a small-sized apparatus.

Other aspects of the present invention will become apparent from the following specific preferred embodiments.

BRIEF DESCRIPTION OF THE DRAWINGS

FIG. 3 is a plan view of a diaphragm of the image pickup system shown in FIG. 1;

FIG. 4 illustrates the ranges where optical filters of the image pickup system shown in FIG. 1 are formed;

FIG. 5 illustrates an objective lens of the image pickup system shown in FIG. 1 which is viewed from the side where light is projected;

FIGS. 17A, 17B, and 17C illustrate the overall structure of the digital color camera shown in FIG. 1;

FIG. 18 is a sectional view of an image pickup system of a digital color camera according to a second embodiment of the present invention;

FIG. 19 is a sectional view of another image pickup system of a digital color camera according to the second embodiment of the present invention;

DESCRIPTION OF THE PREFERRED EMBODIMENTS

Figure 2:
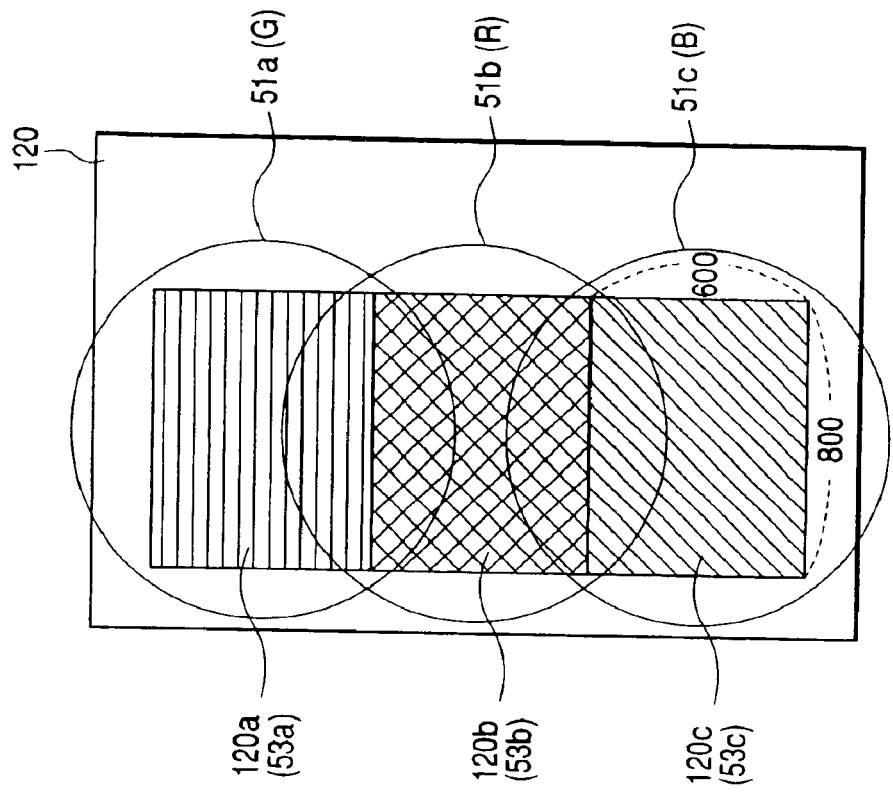
FIG. 2 is a front view of a solid-state image pickup element of the image pickup system shown in FIG. 1.

Preferred embodiments of the present invention are now described in detail with reference to the drawings.

FIGS. 17A, 17B, and 17C illustrate the overall structure of a digital color camera according to a first embodiment of the present invention. FIGS. 17A, 17C, and 17B are a front view, a rear view, and a sectional view taken along the line 17B—17B in the rear view of FIG. 17C, respectively.

In FIGS. 17A, 17B, and 17C, reference numeral 1 denotes a camera body. An illuminating light intake window 2, formed of a white diffusing plate, is positioned at the back of a color liquid crystal monitor 4. Reference numerals 5 and 6 denote a main switch and a RELEASE button, respectively. Reference numerals 7, 8, and 9 are switches for a user to set the state of the camera. In particular, reference numeral 9 denotes a PLAY button. Reference numeral 13 denotes a display of the remaining number of recordable pictures. Object light which is incident on a prism 12 from a viewfinder front frame 3 is projected from a viewfinder eyepiece window 11. Reference numerals 10 and 14 denote an image pickup system and a connection terminal for connecting the camera to an external computer or the like to transmit and receive data, respectively.

Figure 14:
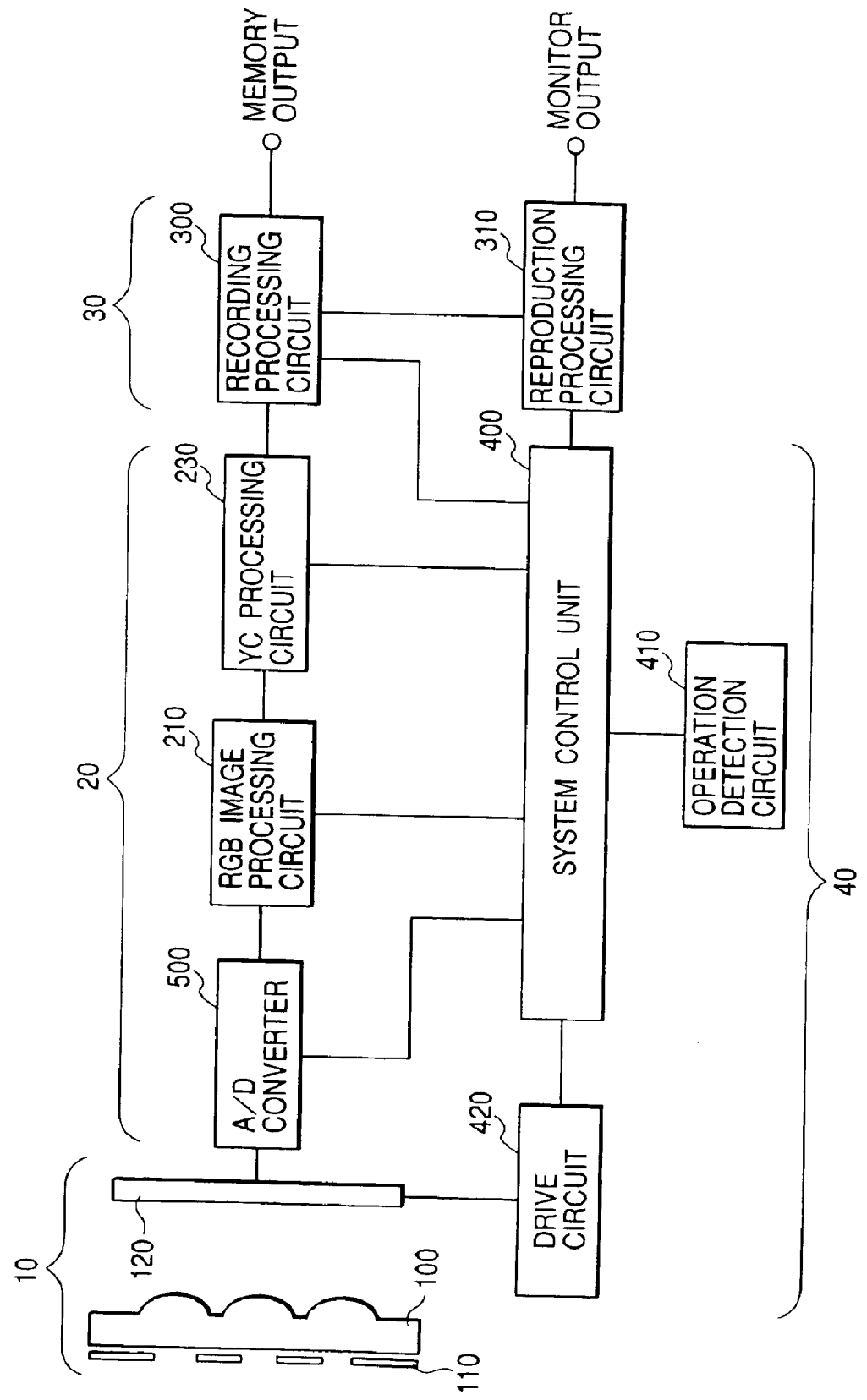
FIG. 14 is a block diagram of a signal processing system of the digital color camera shown in FIG. 1.

The schematic structure of a signal processing system is now described. FIG. 14 is a block diagram of the signal processing system. This camera is a single plate type digital color camera using a solid-state image pickup element 120, such as a CCD or a CMOS sensor. Image signals representing a dynamic image or a still image are obtained by driving the solid-state image pickup element 120 continuously or only once, respectively. Here, the solid-state image pickup element 120 is an image pickup device of the type which converts exposed light into electric signals with regard to the respective pixels, stores respective charges according to the light amount, and reads the respective charges.

It is to be noted that FIG. 14 only shows portions which are directly relevant to the present invention, and illustration and description of portions which are not directly relevant to the present invention are omitted.

As shown in FIG. 14, the image pickup apparatus includes the image pickup system 10, an image processing system 20 (as image processing means), a recording and reproduction system 30, and a control system 40. Further, the image pickup system 10 includes therein an objective lens 100, a diaphragm 110, and the solid-state image pickup element 120; the image processing system 20 includes therein an A/D converter 500, an RGB image processing circuit 210, and a YC processing circuit 230; the recording and reproduction system 30 includes therein a recording processing circuit 300 and a reproduction processing circuit 310; and the control system 40 includes therein a system control unit 400, an operation detection circuit 410, and a drive circuit 420 of the solid-state image pickup element.

The image pickup system 10 is an optical processing system for imaging light incident from an object through the diaphragm 10 and the objective lens 100, on an image pickup plane of the solid-state image pickup element. The light transmission factor of the objective lens 100 is adjusted so as to expose a subject image of an appropriate light amount onto the solid-state image pickup element 120. As described above, as the solid-state image pickup element 120, an image pickup device, such as a CCD and a CMOS sensor, may be used. By controlling the exposure time and the exposure intervals of the solid-state image pickup element 120, image signals representing continuous dynamic images or image signals representing a still image by one exposure can be obtained.

Figure 1:
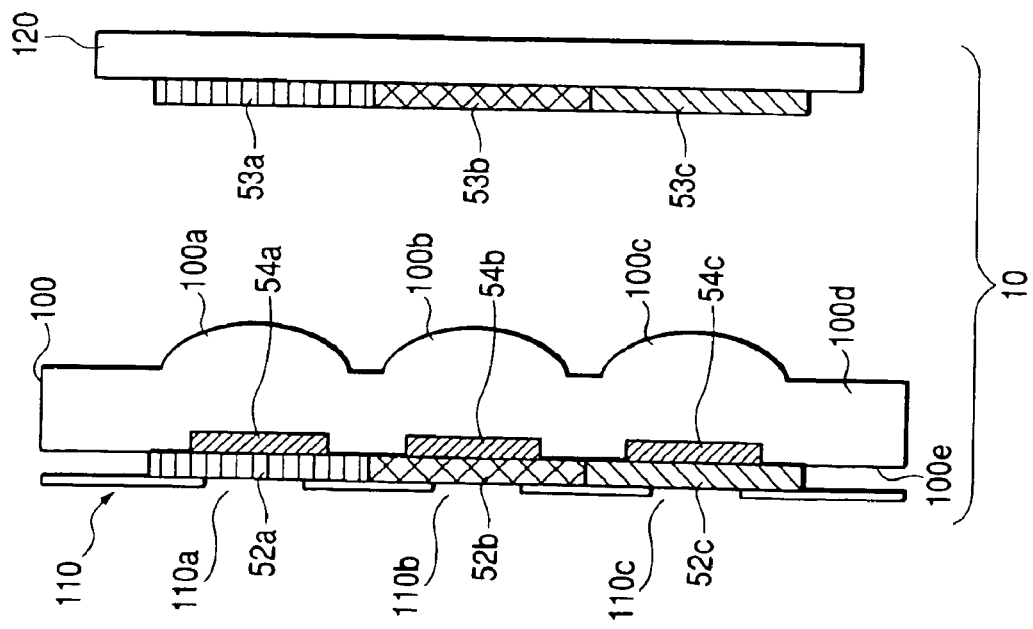
FIG. 1 is a sectional view of an image pickup system of a digital color camera according to an embodiment of the present invention.

FIG. 1 is a detailed view of the image pickup system 10. First, the diaphragm 110 has three circular openings 110a, 110b, and 110c, as shown in FIG. 3. Object light which enters a light incidence plane 100e of the objective lens 100 from the openings is projected from three lens portions 100a, 100b, and 100c of the objective lens 100 so as to form three object images on the image pickup plane of the solid-state image pickup element 120. The diaphragm 10, the light incidence plane 100e, and the image pickup plane of the solid-state image pickup element 120 are arranged parallel with one another. In this way, by making the power on the incidence side weak, making the power on the projection side strong, and providing a diaphragm on the incidence side, the curvature of the image plane can be reduced. It is to be noted that, though the light incidence plane 100e of the objective lens 100 is a plane here, the light incidence plane 100e may be formed of three spherical surfaces or three rotation-symmetry nonspherical surfaces.

The three lens portions 100a, 100b, and 100c have circular spherical surface portions, as shown in FIG. 5, which illustrates the objective lens 100 as viewed from the side where light is projected. An infrared radiation cutting filter having a low transmission factor with regard to a wavelength range of 670 nm and greater is formed on the spherical surface portions, while a light-shielding film is formed on a plane portion 100d shown with hatching. More specifically, the objective optical system is formed by the objective lens 100 and the diaphragm 110, while the three lens portions 100a, 100b, and 100c form the imaging system.

Manufacture is made easy using glass molding in the case where the objective lens 100 is made of glass, and using injection molding in the case where the objective lens 100 is made of resin.

FIG. 2 is a front view of the solid-state image pickup element 120. The solid-state image pickup element 120 is provided with three image pickup regions 120a, 120b, and 120c corresponding to the three object images formed thereon. Each of the image pickup regions 120a, 120b, and 120c are sized to be 2.24 mm×1.68 mm with an arrangement of 800×600 pixels having a vertical and horizontal pitch of 2.8 μm. The overall size of the image pickup regions is 2.24 mm×5.04 mm. The diagonal size of each of the image pickup regions is 2.80 mm. In the figure, image circles 51a, 51b, and 51c, within which an object image is formed, are circular, where the sizes of the circles are determined by the size of the openings of the diaphragm and the spherical surface portions on the projection side of the objective lens 100. The image circles 51a and 51b overlap each other, and the image circles 51b and 51c overlap each other.

In FIG. 1, hatched portions 52a, 52b, and 52c, sandwiched between the diaphragm 110 and the objective lens 100, are optical filters formed on the light incidence plane 100e of the objective lens 100. As shown in FIG. 4, which illustrates the objective lens 100 as viewed from the light incidence side, the optical filters 52a, 52b, and 52c are formed in regions which completely include the diaphragm openings 110a, 110b, and 110c, respectively.

Figure 6:
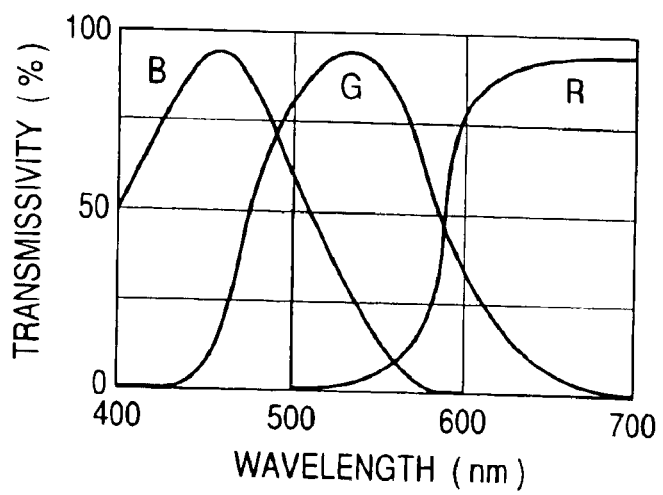
FIG. 6 is a graph showing the spectral transmission factor characteristics of the optical filters of the image pickup system shown in FIG. 1.

The optical filter 52a has spectral transmission factor characteristics shown as G in FIG. 6, which mainly transmit green; the optical filter 52b has spectral transmission factor characteristics shown as R, which mainly transmit red; and the optical filter 52c has spectral transmission factor characteristics shown as B, which mainly transmit blue. Thus, these are primary color filters. As the product with the characteristics of the infrared radiation cutting filter formed on the lens portions 100a, 100b, and 100c, the object images formed in the image circles 51a, 51b, and 51c are of green light component, red light component, and blue light component, respectively.

On the other hand, optical filters 53a, 53b, and 53c are formed on the three image pickup regions 120a, 120b, and 120c, respectively, of the solid-state image pickup element 120. Their spectral transmission factor characteristics are equivalent to the ones shown in FIG. 6. More specifically, the image pickup regions 120a, 120b, and 120c are sensitive to green light (G), red light (R), and blue light (B), respectively.

Since the spectral distributions of the received light of the respective image pickup regions are given as the product of the spectral transmission factors of the pupils and the spectral transmission factors of the image pickup regions, respectively, the combination of each pupil and the image pickup region is selected according to the wavelength range. More specifically, object light which goes through the diaphragm opening 110a is mainly photoelectrically converted in the image pickup region 120a; object light which goes through the diaphragm opening 110b is mainly photoelectrically converted in the image pickup region 120b; and object light which goes through the diaphragm opening 110c is mainly photoelectrically converted in the image pickup region 120c. In other words, the image pickup regions 120a, 120b, and 120c output a G image, an R image, and a B image, respectively. In this way, by using multiple optical filters for the purpose of color separation on the pupils of the image pickup optical system and on the image pickup element, the color purity can be enhanced. This is because, by using the same kind of optical filters twice, the buildup of the transmission factor characteristics becomes steeper, and the red color (R) and the blue color (B) do not overlap each other. It is to be noted that the transmission factors of the optical filters 52a, 52b, and 52c, or of the optical filters 53a, 53b, and 53c, are preferably set so as to provide appropriate signal levels in the respective image pickup regions in the same accumulation time.

In the image processing system 20, a color image is formed based on the selective photoelectric conversion output obtained from the plurality of images by the plurality of image pickup regions of the solid-state image pickup element 120, respectively. Here, since the peak wavelength of the spectral luminous efficiency is 555 nm, signal processing is carried out using a G image signal including this wavelength, as the reference image signal.

When the pixel pitch of the solid-state image pickup element is fixed, compared with a system adopted generally by a digital color camera, in which an RGB color filter is formed on the solid-state image pickup element with, for example, 2×2 pixel block basis to provide wavelength selectability to each pixel, and thus, an object image is separated into RGB images, the size of the object image is $1/\sqrt{3}$ times, and thus, the focal length of the objective lens is about $1/\sqrt{3}$ times, which is quite advantageous in making the camera thin.

It is to be noted that, with regard to the spectral transmission factor characteristics of the optical filters 52a, 52b, and 52c and of the optical filters 53a, 53b, and 53c, as shown in FIG. 6, R and G overlap each other and G and B overlap each other, though R and B are substantially separated from each other.

Therefore, even when the image circle 51b of the red light overlaps the image pickup region 120c for photoelectrically converting the blue light, and conversely, even when the image circle 51c of the blue light overlaps the image pickup region 120b for photoelectrically converting the red light, these images do not become the output of the image pickup regions. However, at the portion where the image circle 51b of the red light overlaps the image pickup region 120a for photoelectrically converting the green light and at the portion where the image circle 51a of the green light overlaps the image pickup region 120b for photoelectrically converting the red light, a small amount of an image of a different wavelength which should be blocked is superimposed thereon. More specifically, since the selectivity of the object image is given by the product of the spectral transmission factor characteristics of the optical filter 52a and the spectral transmission factor characteristics of the optical filter 53b, and by the product of the spectral transmission factor characteristics of the optical filter 52b and the spectral transmission factor characteristics of the optical filter 53a, the cross-talk of the R image signal and the G image signal does not become zero, although it is small.

Therefore, the objective lens 100 is further provided with characteristics to lower the transmission factor of the wavelength range of the portion where R and G overlap each other. This can be carried out by using optical filtering technology implemented by a color purity correction filter.

The color purity correction filter is an optical filter formed of a base material made of a transparent synthetic resin or glass having a predetermined amount of rare-earth metal ions contained therein.

As the rare-earth metal ions, one or more selected among neodymium ions, praseodymium ions, erbium ions, and holmium ions are used. However, it is preferable that at least neodymium ions are used as indispensable ions. It is to be noted that trivalence ions are generally used as these ions. The content of the metal ions is selected in a range of normally 0.01 to 40 mass parts, preferably 0.04 to 30 mass parts relative to 100 mass parts of the base material of the objective lens 100.

Figure 7:
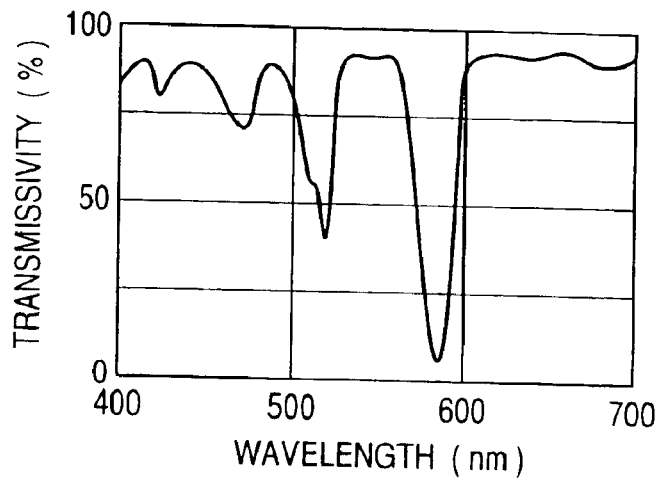
FIG. 7 is a graph showing the spectral transmission factor characteristics of a color purity correction filter of the image pickup system shown in FIG. 1.

As shown in FIG. 7, the color purity correction filter has characteristics that selectively absorb light in a predetermined wavelength range between the peak wavelengths of the color components of R, G, and B, so as to decrease the amount of transmission thereof. This action almost eliminates cross-talk due to the overlap of the image circle 51b of the red light and the image pickup region 120a for photoelectrically converting the green light, and the overlap of the image circle 51a of the green light and the image pickup region 120b for photoelectrically converting the red light.

Further, the objective lens 100 is also provided with photochromic characteristics, which is a phenomenon to be darkened by light and to be reversibly achromatized when the irradiation of light is stopped. In this manner, since the accumulation time control range of the solid-state image pickup element 120 is limited, the amount of light reaching the solid-state image pickup element is suppressed when the field is extremely bright, thereby enlarging the recordable intensity range.

As the photochromic glass, for example, photochromic glass of phosphate glass made by Chance-Pilkington, which has been put to practical use for spectacles (Product name: Reactolite Rapide), may be used.

Figure 8:
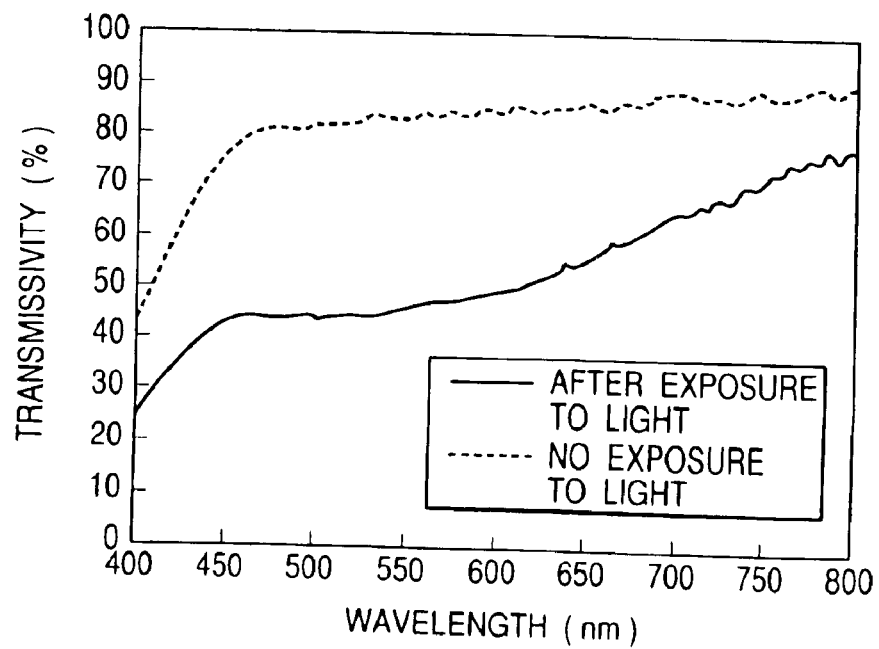
FIG. 8 is a graph showing the spectral transmission factor characteristics of a photochromic glass of the image pickup system shown in FIG. 1.

FIG. 8 is a graph showing the spectral transmission factor characteristics of a photochromic glass used as the objective lens 100. In FIG. 8, a solid line shows the characteristics after exposure to sunlight for 20 minutes, while a broken line shows the characteristics with no exposure to sunlight. When the camera is carried about by a user, outdoors under a blue sky or the like, light beams which enter the objective lens 100 from the diaphragm 110 make the objective lens 100 itself darkened so as to suppress the amount of light entering the solid-state image pickup element 120 by about ½. As a result, the accumulation time can be made twice as long, which raises the control limitation on the high intensity side.

The screen size of each of the image pickup regions 120a, 120b, and 120c is 2.24 mm×1.68 mm, as described above, since the pixel pitch is 2.8 µm and the number of the pixels is 800×600. The diagonal screen size of each of the image pickup regions is 2.80 mm. Generally, when the image pickup angle θ of a small-sized camera is about 70° in the diagonal direction, the camera is most convenient. When the image pickup angle is 70° the focal length is 2.0 mm in this case, since it is determined by the diagonal size of the screen.

When a person or the like is the subject of recording, considering that a person is about 170 cm tall, and one person to three people are often recorded at a time, a virtual distance D to the subject [m] can be defined as in the following equation (1) as a function of the image pickup angle θ[°]

$$D=1.4/\tan(\theta/2) \qquad (1)$$

Substituting 70° for θ in equation (1), D=2.0 m is obtained. Here, if the image pickup system 10 is formed so as to focus on the subject best when the distance to the subject is 2 m, the letting out of the lens from the point at infinity is 0.002 mm. Taking into consideration the allowable circle of confusion to be described later, practically no problem is caused even if the image pickup system is a fixed focus image pickup optical system without a mechanism for letting the lens out.

The focal length f of a planoconvex lens in air can be represented as follows:

$$f=\{1/(1-n)\}r \qquad (2)$$

wherein n is the index of refraction and r is the radius of the spherical surface. Therefore, if the index of refraction n of the objective lens 100 is 1.5, for example, r for obtaining a focal length of 2.0 mm is 1.0 mm.

It is convenient to make equal the sizes of the red, green, and blue object images, since there is no need to make correction of the image magnification, and thus, the processing time is not elongated. Therefore, the lens portions 100a, 100b, and 100c are optimized for the peak wavelengths of 530 mm, 620 nm, and 450 nm of the lights which go through the RGB optical filters, respectively, so as to make equal the magnifications of the respective images. This can be paraxially materialized by making equal the distance from the positions of the principal points of the respective lens portions to the solid-state image pickup element.

In the case of glass having an index of refraction of the d line (587.6 nm) $n_d$=1.5 and an Abbe number $v_d$=60, the indexes of refraction at the wavelengths of 530 nm, 620=nm, and 450 nm are about 1.503, 1.499, and 1.509, respectively. If all the radii r of the spherical surfaces of the lens portions 100a, 100b, and 100c equal −1.0 mm, the focal lengths at the respective wavelengths are, by equation (2), as follows:

for a lens portion 100a having a representative wavelength of 530 nm: 1.988 mm, for a lens portion 100b having a representative wavelength of 620 nm: 2.004 mm, and for a lens portion 100c having a representative wavelength of 450 nm 1.965 mm.

Suppose from the pixel pitch that the allowable circle of confusion is 3.0 µm, and further suppose that the f-number of the objective lens is F5.6, then the depth of focus represented as the product of the two is 16.8 µm. It can be seen that the difference 0.039 mm between the focal length in the case of 620 nm, and the focal length in the case of 450 nm, already exceeds this. More specifically, though the paraxial image magnifications are the same, depending on the color of the subject, the subject may be out of focus. Since the spectral transmission factor of an object normally ranges over a wide wavelength range, it is quite rare that a sharp image in focus can be obtained.

Accordingly, the radii r of the spherical surfaces of the lens portions 100a, 00b, and 100c are optimized with regard to the respective representative wavelengths. More specifically, here, achromatism for removing the chromatic aberration over the whole visible region is not carried out, and designs for the wavelengths are applied to the respective lenses. First, the equation (2) is transformed to obtain the following equation (3):

$$r=(1-n)f \qquad (3)$$

Inserting f=2.0 and inserting in sequence n=1.503, n=1.499, and n=1.509 in equation (3), the following respective radii are calculated:

for a lens portion 100a having a representative wavelength of 530 nm: r=−1.006 mm, for a lens portion 100b having a representative wavelength of 620 nm: r=−0.998 mm, and for a lens portion 100c having a representative wavelength of 450 nm: r=−1.018 rom.

In order to make well-balanced the difference in the image magnifications at a high position of an image, the heights of the vertices of the lens portions 100a, 100b, and 100c are slightly adjusted, and then, both the sharpness and the image magnification are ideal. Further, non-spherical surfaces are used for the respective lens portions to satisfactorily correct the curvature of the image plane. With regard to distortion of the image, it can be corrected in the signal processing to be carried out later.

In this way, when reference G image signals generated by green object light including the wavelength of 555 nm, which has the highest luminosity factor, and image signals generated by the red and blue object lights, respectively, are obtained, and different focal lengths are set with regard to one wavelength and a substantially equal focal length is set with regard to the representative wavelengths in the respective spectral distribution in the imaging system, then by compositing these image signals, a color image with satisfactory correction of the chromatic aberration can be obtained. Since each of the imaging systems is formed of one lens, there also can be attained the technological advantage of making the imaging system thin. Further, though achromatism normally requires a combination of two lenses having different dispersions, the achromatism is carried out here by only one lens, and thus, there also can be attained the technological advantage of lowering the cost.

The objective lens 100 is required to have high contrast image dissection up to a spatial frequency range as high as the pixel pitch. The image pickup system takes in three object images with regard to the three wavelength ranges, and thus, compared with an image pickup system provided with a mosaic optical filter, such as of a Bayer arrangement having the same number of pixels, as described above, the focal length is about $1/\sqrt{3}$ times to attain the same image pickup angle. Therefore, it is necessary to materialize high contrast image dissection of higher spatial frequency component. The optimization with regard to the respective wavelengths of the lens portions described above is a technology that suppresses chromatic aberration for the purpose of materializing this.

Generally, there are two methods for improving the aberration characteristics of an image pickup optical system to make spurious resolution less liable to occur, thereby alleviating problems: one method is to increase the degree of freedom in designing by, for example, increasing the number of lenses forming the system, by making the lenses nonspherical, using anomalous dispersion glass, or by complexly using diffraction optical elements; and the other method is to narrow the imaging light beam.

The former method, that is, increasing the degree of freedom in design, though having a focal length that is $1/\sqrt{3}$ times in size, increases the complexity of the structure of the objective optical system, which goes against the desired result of making the image pickup apparatus thin, and thus, is inappropriate. On the other hand, the latter method, that is, use of a narrower light beam, conforms to a thin image pickup apparatus.

Figure 10:
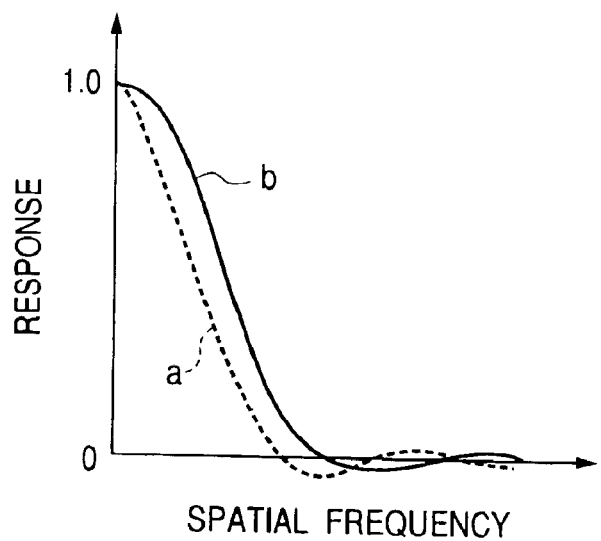
FIG. 10 is a graph showing the OTF characteristics of the objective lens of the image pickup system shown in FIG. 1.

When an imaging light beam is made more narrow, as shown by a solid line b in FIG. 10, the response function referred to as OTF first presents a gradual monotone decrease in the low frequency component, then becomes slightly negative, and thereafter, becomes slightly positive. On the other hand, in the case where a broad light beam is used, as shown by a broken line a in FIG. 10, the response function first presents a steep decrease in the low frequency component, then becomes temporarily negative, and thereafter becomes positive again.

The state where the OTF is negative indicates occurrence of spurious resolution. This corresponds to an actual state where reversal of negative/positive image occurs, that is, a portion which should be white is black while a portion which should be black is white. It makes it clear that a natural image can be obtained by making the imaging light beam more narrow.

However, when the imaging light beam is made extremely narrow, the contrast in a high frequency range is decreased due to diffraction of light. In this state, an image is formed of a bright spot at the center with diffraction stripes surrounding the bright spot. These are caused by, as is well known, relative increase in the intensity of the diffraction stripes due to peripheral waves generated on the periphery of the opening of the diaphragm.

The diffraction stripes can be decreased by adding to the objective lens a filter which is transparent at the center and becomes darker toward the periphery. This method is referred to as apodization, which is described in detail on pages 172 to 174 of "Kogaku Gijutsu Handbook Zohoban (Handbook of Optical Technology, Enlarged Edition)" (1975, Asakura Shoten).

Figure 9:
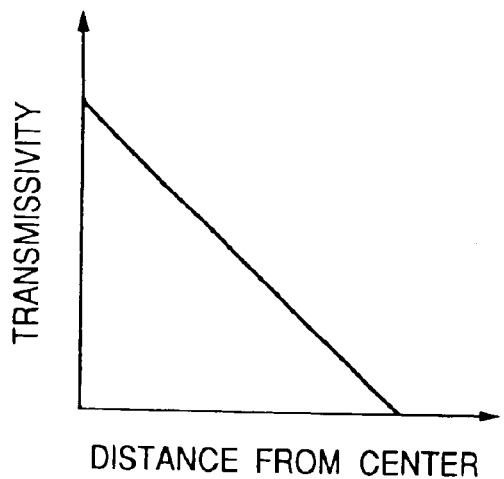
FIG. 9 is a graph showing the transmission factor distribution of a transmission factor distribution type filter of the image pickup system shown in FIG. 1.

FIG. 9 is a graph showing the transmission factor distribution of transmission factor distribution type filters provided on the light incidence plane 100e of the objective lens 100 so as to face the diaphragm openings 110a, 110b, and 110c. The transmission factor distribution type filters are denoted as 54a, 54b, and 54c in FIG. 1. The positions where the transmission factor is the highest correspond to the centers of the diaphragm openings 110a, 110b, and 110c, while the positions where the transmission factor is zero correspond to the periphery of the openings 110a, 110b, and 110c, respectively, of the diaphragm. In other words, the transmission factor is distributed so as to be the highest at the centers of the diaphragm openings, and monotonically decreases, toward the periphery.

Such a transmission factor distribution type filter is formed by forming a thin film of Inconel, Chromel, chromium or the like by vapor deposition or sputtering on the light incidence side of the objective lens 100. The characteristics shown in FIG. 9 can be obtained by making the thin film the thinnest at the center and the thickest on the periphery. It is to be noted that, in forming such a thin film, the position of a mask used in the vapor deposition or sputtering is continuously controlled.

Though the transmission factor distribution type filters 54a, 54b, and 54c are formed on the objective lens here, they may be formed on a glass plate arranged on the light incidence side or the light projection side of the objective lens 100.

Figure 11:
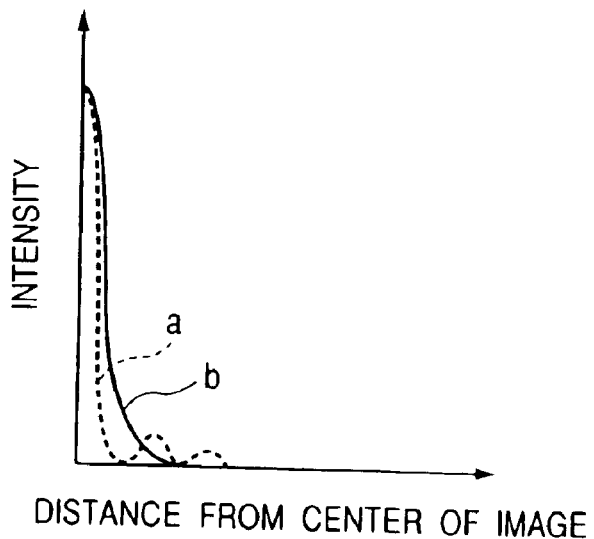
FIG. 11 is a graph showing the intensity distribution in an image by the image pickup system shown in FIG. 1.

FIG. 11 is a graph showing the intensity distribution in an image. In the figure, a broken line a shows a case where the transmission factor is constant over the entire diaphragm opening, while a solid line b shows a case where the transmission factor is decreased from the center of the diaphragm opening toward the periphery. Compared with the case of the characteristics shown by a, there is no bound on the periphery of the image in the characteristics shown by b, which clearly shows that the image formed is satisfactory. Here, this reflects the technological advantage of decreasing the diffraction stripes by decreasing peripheral light beams by means of apodization.

Figure 12:
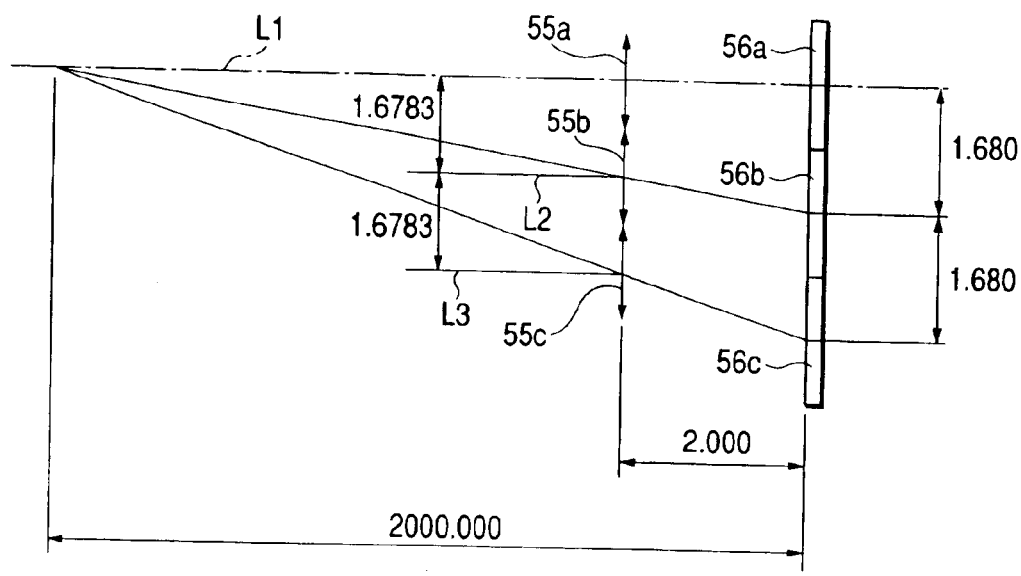
FIG. 12 is an explanatory view for explaining the setting of the intervals between lens portions of the image pickup system shown in FIG. 1.

Next, the relationship between the objective lens and the image pickup regions is described. Since the image pickup system has three lens portions, the positions of the three object images relatively change according to the distance to the subject. As described above, each of the image pickup regions is sized to be 2.24 mm×1.68 mm, and the image pickup regions are arranged adjacent to each other with their long sides being in contact with each other. Therefore, the center-to-center distance of adjoining image pickup regions is 1.68 mm. In the YC processing circuit 230, to be described later, signal processing is carried out on the assumption that the center of an object image is the center of the image pickup region. When an object image with a virtual object distance of 2 m is to be formed on the image pickup portion at the same intervals as that distance, as shown in FIG. 12, the interval between the lens portions 100a and 100b and between the lens portions 100b and 100c is set to be 1.6783 mm. In the figure, arrows 55a, 55b, and 55c denote imaging systems having positive power by the three lens portions 10a, 100b, and 100c of the objective lens 100, respectively, rectangles 56a, 56b, and 56c denote the ranges of the image pickup regions 120a, 120b, and 120c, respectively, and L1, L2, and L3 are optical axes of the imaging systems 55a, 55b, and 55c, respectively. Since the light incidence surface of the objective lens 100 is a plane, and the lens portions 100a, 100b, and 100c forming the light projection surface are spherical surfaces, perpendicular lines extending from the respective centers of the spheres to the light incidence plane 100e define the optical axes.

Figure 13:
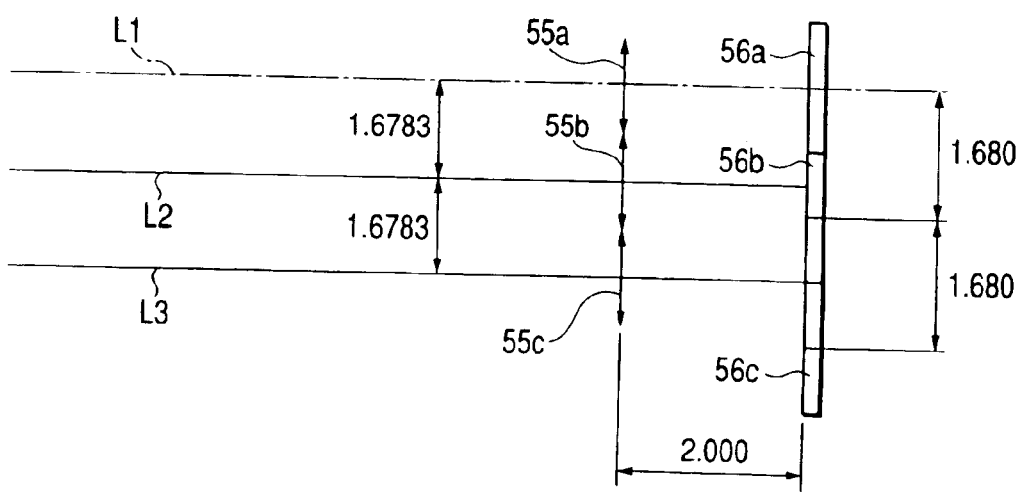
FIG. 13 is an explanatory view for explaining the positions of images of an object at infinity of the image pickup system shown in FIG. 1.

Here, as shown in FIG. 13, images of an object at infinity are formed at the same intervals as that of the lens portions 100a, 100b, and 100c, and thus, the interval between the G object image and the R object image and the interval between the R object image and the B object image are 1.6783 mm, which is a little smaller than the center-to-center distance of the image pickup regions of 1.68 mm. The difference Δy is 0.0017 mm, i.e., 1.7 μm. With the G object image, which has the highest luminosity factor, being used as the reference object image, when the B object image moves, the difference ΔY is doubled and is 3.4 μm. Since it is often the case that a short-range object, such as a person, is positioned in the middle of a picture to be picked up, and that a long-range object is positioned on the periphery of the picture, and, since the aberration of the objective lens increases on the periphery of the picture so as to lower the quality of an image, it can be understood that practically no problem arises if the maximum image interval change is smaller than the pixel pitch multiplied by two. As described above, since the pixel pitch P of the solid-state image pickup element 120 is 2.8 m, it follows that ΔY<2×P, and thus, the color misalignment in an image at infinity to this extent is allowable.

Further, the interval between the images varies also in accordance with a temperature change in the image pickup system 10. Since the imaging magnification of the image pickup system 10 is extremely small, the image interval variation ΔZ can be expressed as the difference between the expansion of the objective lens and the expansion of the solid-state image pickup element in the following equation (4):

$$Z = 1.68 \times (\alpha L - \alpha s) \times \Delta T \quad (4)$$

wherein αs is the coefficient of linear expansion of the solid-state image pickup element 120, αL is the coefficient of linear expansion of the objective lens 100, and ΔT is the temperature change.

Here, when $\alpha S = 0.26 \times 10^{-5}$, ΔT=20[°C.], and the objective lens 100 is formed of low-melting glass and $\alpha L = 1.2 \times 10^{-5}$, ΔZ is calculated at 0.00032 [mm]. This is the variation in the interval between the G object image and the R object image and the variation in the interval between the R object image and the B object image.

When the B object image is regarded as a variation with respect to the G object image, which generates the reference image signals, since the interval between the images is 1.68×2, the image interval variation is ΔZ×2=0.00063 [rom]. When the temperature range where the camera is used is 0 to 40° C., the deviation ΔT from the reference temperature of 20° C. is 20° C. Here, if ΔZ×2 is smaller than ½ of the pixel pitch, there is practically no problem. Generally, since the coefficient of linear expansion as of the solid-state image pickup element 120 is as small as about $0.26 \times 10^{-5}$, it is necessary to select the coefficient of linear expansion αL of the objective lens 100 so as to satisfy the following expression (5):

$$2 \times A \times (\alpha L - 0.26 \times 10^{-5}) \times 20 < \frac{1}{2} P \quad (5)$$

wherein A is either the interval between the G image and the R image or the interval between the R image and the B image, and P is the pixel pitch.

Since the coefficient $\alpha L \ (= 1.2 \times 10^{-5})$ of linear expansion of the objective lens 100 used above satisfies the relationship expressed by the expression (5), it can be understood that the material of the lens 100 is suitable for the camera.

Further, apart from the fluctuation of the image interval due to the distance to the object and due to temperature change, a method referred to as pixel shift is used where, by relatively shifting the image pickup regions 120a, 120b, and 120c of the solid-state image pickup element by ½ pixel, the resolution is made higher with a small number of pixels. The amount of the shift of ½ pixel is set with regard to the virtual object distance of 2 m.

Figure 15:
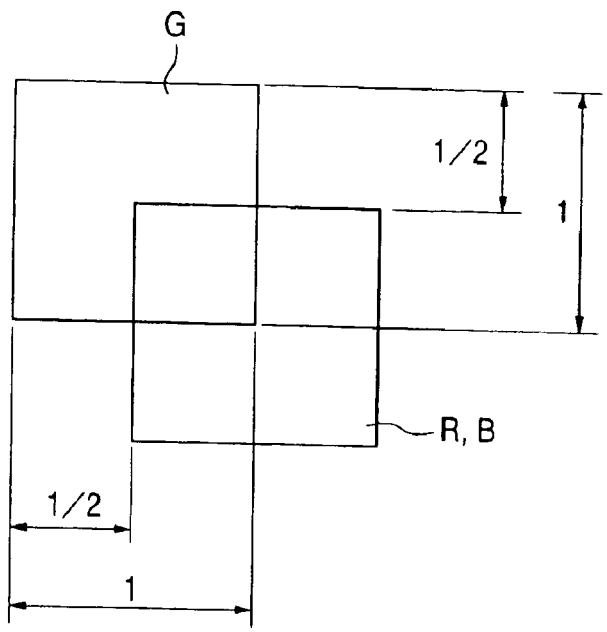
FIG. 15 illustrates the positional relationship of the image pickup region for R and B pixels with respect to the image pickup region for a G pixel of the image pickup system shown in FIG. 1.
Figure 16:
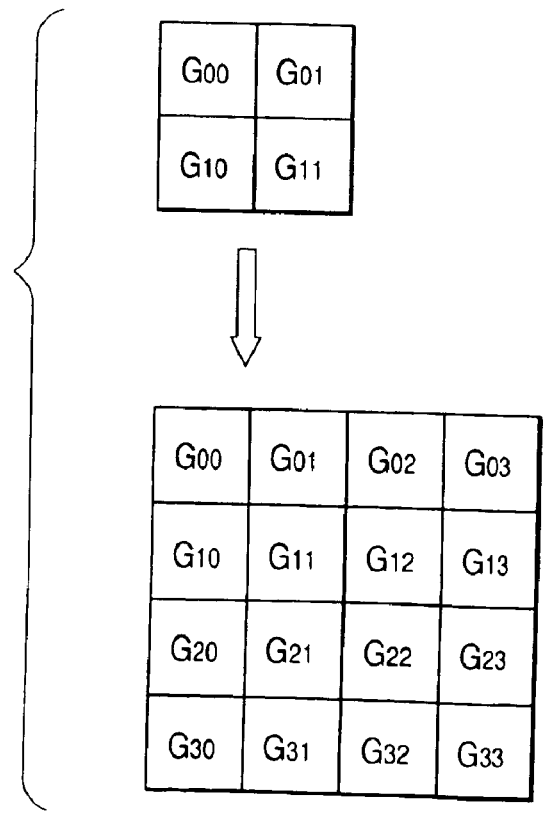
FIG. 16 is an explanatory view of interpolation processing of the digital color camera shown in FIG. 1.

As shown in FIG. 15, the image pickup region 120b for outputting the R image signals and the image pickup region 120c for outputting the B image signals are arranged so as to be shifted by ½ pixel both in the horizontal direction and in the vertical direction with respect to the image pickup region 120a for outputting the G image signals.

This pixel shift may be materialized by making the lens portions 100b and 100c of the objective lens 100 slightly offset with respect to the lens portion 100a; or may be materialized by making the image pickup regions 120b and 120c of the solid-state image pickup element 120 slightly offset with respect to the image pickup region 120a.

In an optical filter arrangement, such as the Bayer arrangement, since, for example, a pixel provided with a red optical filter or a pixel provided with a blue optical filter is arranged between pixels provided with a green optical filter, an optical low-pass filter for suppressing aliasing is necessary. However, in the case that images having different spectral distributions are taken in with regard to different image pickup regions, pixels provided with the respective optical filters can be densely arranged, and, as a result, the influence of the aliasing is small, and thus, a high definition image can be obtained without the need for the optical low-pass filter. This makes it possible to miniaturize the image pickup system and to substantially lower the cost.

Next, the signal processing is described.

As described above, an image pickup device having 1,800 pixels in its lengthwise direction and 800 pixels in its breadthwise direction, i.e., having 1,440,000 pixels in total, is effectively applied to the solid-state image pickup element 120. Optical filters of the three primary colors, that is, red (R), green (G), and blue (B), are arranged on its front surface in predetermined regions, respectively.

As shown in FIG. 14, image signals read from the solid-state image pickup element 120 are supplied to the A/D converter 500 of the image processing system 20. The A/D converter 500 is, for example, a signal converting circuit for converting the signals into digital signals of, for example, ten bits according to the amplitude of the signal of each pixel and for outputting the converted signals. Then, the image signal processing is carried out in digital processing.

The image processing system 20 has a signal processing circuit for obtaining image signals of a desired format from R, G, and B digital signals, and converts the R, G, and B color signals into YC signals expressed by a luminance signal Y and chrominance signals (R-Y) and (B-Y), or the like.

The RGB image processing circuit 210 is a signal processing circuit for processing the pixel signals of the 1800× 800 pixels received from the solid-state image pickup element 120 through the A/D converter 500, and has a white balance circuit, a gamma control circuit, and an interpolation circuit for making the resolution higher by interpolation.

The YC processing circuit 230 is a signal processing circuit for generating a luminance signal Y and chrominance signals R-Y and B-Y. The YC processing circuit 230 is formed of a high luminance signal generating circuit for generating a high luminance signal YH, a low luminance signal generating circuit for generating a low luminance signal YL, and a chrominance signal generating circuit for generating chrominance signals R-Y and B-Y. A luminance signal Y is formed by compositing a high luminance signal YH and a low luminance signal YL.

The RGB image processing circuit 210 is now described in detail.

RGB signals output through the A/D converter 500 with regard to the R, G, and B regions, respectively, are first subject to predetermined white balance adjustment in the white balance circuit in the RGB image processing circuit 210, and then are subjected to predetermined gamma control in the gamma control circuit.

The interpolation circuit in the RGB image processing circuit 210 generates, by interpolation, image signals having a resolution which is four times as much as that of the 600×800 pixels, converts the image signals from the solid-state image pickup element 120 into signals having high definition image quality, and supplies them to the high luminance signal generating circuit, the low luminance signal generating circuit, and the chrominance signal generating circuit at the subsequent stage.

Since the sizes of the R, G, and B object images are already the same based on the setting of the objective lens 100, first, by a publicly known method, arithmetic processing for correcting optical aberration of the objective optical system is carried out with regard to the respective image signals. After that, the interpolation processing, the luminance signal processing, and the chrominance signal processing, which are the same as those of an ordinary digital color camera, are performed. The interpolation processing is as follows.

First, a G image signal, which is a reference image signal from the image pickup region 120a, is subjected to interpolation according to the following equations (6) to (9):

$$G2i2j = Gij \qquad (6)$$

$$G2i(2j+1) = Gij \cdot \tfrac{1}{2} + Gi(j+1) \cdot \tfrac{1}{2} \qquad (7)$$

$$G(2i+1)2j = Gij \cdot \tfrac{1}{2} + G(i+1)j \cdot \tfrac{1}{2} \qquad (8)$$

$$G(2i+1)(2j+1) = Gij \cdot \tfrac{1}{4} + Gi(j+1) \cdot \tfrac{1}{4} + G(i+1)j \cdot \tfrac{1}{4} + G(i+1)(j+1) \cdot \tfrac{1}{4} \qquad (9)$$

That is, 16 G elements are generated from each four G pixels, and thus the G image signals of 600×800 pixels from the image pickup region 120a are converted into 1200×1600 pixels.

Then, R image signals from the image pickup region 120b corresponding to the respective positions of the G image signals calculated using the above equations (6) to (9) are subjected to interpolation according to the following equations (10) to (13):

$$R2i2j = R(i-1)(j-1) \cdot \tfrac{1}{4} + R(i-1) \cdot \tfrac{1}{4} + Ri(j-1) \cdot \tfrac{1}{4} + Rij \cdot \tfrac{1}{4} \qquad (10)$$

$$R2i(2j+1) = R(i-1)j \cdot \tfrac{1}{2} + Rij \cdot \tfrac{1}{2} \qquad (11)$$

$$R(2i+1)2j = Ri(j-1) \cdot \tfrac{1}{2} + Rij \cdot \tfrac{1}{2} \qquad (12)$$

$$R(2i+1)(2j+1) = Rij \qquad (13)$$

Since, as described above, the image pickup region of the R object image and the image pickup region of the B object image are arranged so as to be shifted by ½ pixel from the image pickup region of the G object image, the original output of the ij address is applied to the (2i+1)(2j+1) addresss, as indicated by equation (13).

Similarly to the R image signals, B image signals from the image pickup region 120c corresponding to the respective positions of the G image signals calculated using the above equations (6) to (9) are subjected to interpolation according to the following equations (14) to (17):

$$B2i2j = B(i-1) \cdot \tfrac{1}{4} + B(i-1)j \cdot \tfrac{1}{4} + Bi(j-1) \cdot \tfrac{1}{4} + Bij \cdot \tfrac{1}{4} \qquad (14)$$

$$B2i(2j+1) = B(i-1)j \cdot \tfrac{1}{2} + Bij \cdot \tfrac{1}{2} \qquad (15)$$

$$B(2i+1)2j = Bi(j-1) \cdot \tfrac{1}{2} + Bij \cdot \tfrac{1}{2} \qquad (16)$$

$$B(2i+1)(2j+1) = Bij \qquad (17)$$

By the above processing, the R, G, and B signals of 600×800 pixels from the image pickup regions 120a, 120b, and 120c are converted into R, G, and B signals of 1200×1600 pixels having high definition image quality, respectively.

The high luminance signal generating circuit in the YC processing circuit 230 is a publicly known signal forming circuit for forming a high luminance signal YH from a color signal having the highest spatial frequency component among color component signals. The low luminance signal generating circuit is a publicly known signal forming circuit for forming luminance signal YL of low frequency from a signal containing all the color components of R, G, and B. The chrominance signal generating circuit is a publicly known arithmetic circuit for calculating chrominance signals R-Y and B-Y from high definition RGB signals.

The recording and reproduction system 30 is a processing system for outputting image signals to the memory and outputting image signals to the liquid crystal monitor 4, and includes a recording processing circuit 300 for writing and reading image signals into and from the memory, and a reproduction processing circuit 310 for reproducing image signals read from the memory as output to the monitor. More specifically, the recording processing circuit 300 includes a compressing and expanding circuit for compressing YC signals representing a still image or a dynamic image according to a predetermined compression format, and for expanding the compressed data when it is read from the memory. The compressing and expanding circuit includes a frame memory for signal processing and the like. YC signals from the image processing system 20 are stored on a frame-by-frame basis, the signals are read on a plurality of block basis, and the signals are compression encoded. The compression encoding is carried out by, for example, two-dimensional orthogonal transformation, normalization, and encoding according to Huffman method on the block basis.

The reproduction processing circuit 310 is a circuit for carrying out matrix conversion of the luminance signal Y and the chrominance signals R-Y and B-Y into, for example, RGB signals. Signals converted by the reproduction processing circuit 310 are output to the liquid crystal monitor 4. Thus, a visible image is displayed and reproduced.

On the other hand, the control system 40 includes control circuits for controlling, in response to external operation, the image pickup system 10, the image processing system 20, and the recording and reproduction system 30, respectively. It detects depression of the RELEASE button 6 so as to control driving of the solid-state image pickup element 120, operation of the RGB image processing circuit 210, compression processing of the recording processing circuit 300, and the like. More specifically, the control system 40 includes an operation detection circuit 410 for detecting the operation of the RELEASE button 6, a system control unit 400 for controlling the respective portions in response to the detection signal and generating and outputting timing signals when an image is picked up and the like, and a drive circuit 420 for the solid-state image pickup element 120, which, under control of the system control unit 400, generates drive signals for driving the solid-state image pickup element 120.

Next, operation of the image pickup apparatus according to the present embodiment is described with reference to FIGS. 14 and 17A to 17C. First, when the main switch 5 is turned on, power source voltage is supplied to the respective portions and then they become operable. Then, it is determined whether an image signal can be recorded or not in the memory. Here, the number of recordable pictures is displayed on the display area 13 for the remaining number of pictures in a liquid crystal monitor 4 according to the remaining capacity. An operator sees the display and, if a picture is recordable, directs the camera to the field and presses down the RELEASE button 6.

When the RELEASE button 6 is pressed down halfway, the exposure time is calculated. When all the preparatory processing for taking a picture is completed, the camera is in a recordable state, and the operator is informed of this through the display. When the RELEASE button 6 is pressed down fully, the operation detection circuit 410 transmits a detection signal to the system control unit 400. Here, the exposure time calculated in advance is counted. When the predetermined exposure time has elapsed, a timing signal is supplied to the drive circuit 420. Then, the drive circuit 420 generates horizontal and vertical drive signals to sequentially read each of the exposed 1600×800 pixels in the horizontal direction and in the vertical direction.

The read signals of respective pixels are converted by the A/D converter 500 into digital signals of a predetermined number of bits to be sequentially supplied to the RGB image processing circuit 210 of the image processing system 20. The RGB image processing circuit 210 carries out interpolation to quadruple the pixel resolution after white balance adjustment and gamma control, and supplies the signals to the YC processing circuit 230.

In the YC processing circuit 230, the high luminance signal generating circuit generates high luminance signal YH with regard to the respective RGB pixels, and similarly, the low luminance signal generating circuit generates low luminance signal YL. The calculated high luminance signal YH is output to an adder through a low-pass filter. In the same way, the low luminance signal YL, after subtraction of the high luminance signal YH, is output to the adder through the low pass filter. In this manner, the difference YL-YH between a high luminance signal and a low luminance signal is added to obtain a luminance signal Y. Similarly, the chrominance signal generating circuit generates and outputs chrominance signals R-Y and B-Y. Components of the output chrominance signals R-Y and B-Y, which come through the low-pass filter, are supplied to the recording processing circuit 300.

Next, the recording processing circuit 300 receives the YC signals, compresses the respective luminance signal Y and chrominance signals R-Y and. B-Y with a predetermined still image compression method, and records them sequentially in the memory.

When a still image or a dynamic image is reproduced from image signals stored in the memory, the PLAY button 9 is pressed down. Then, the operation detection circuit 410 detects this operation and supplies a detection signal to the system control unit 400, which starts a driving operation of the recording processing circuit 300. The driven recording processing circuit 300 reads the recorded content from the memory so as to display images on the liquid crystal monitor 4. The operator selects a desired image by pressing down a SELECT button or the like.

FIG. 18 illustrates a second embodiment of the image pickup system. Similarly to the case of the first embodiment, the diaphragm 110 of an image pickup system 790 has three circular openings 110a, 110b, and 110c as shown in FIG. 3. Object light that enters the light incidence plane 100e of the objective lens 100 from the openings is projected from the three lens portions 100a, 100b, and 100c of the objective lens 100 so as to form three object images on the image pickup plane of the solid-state image pickup element 120.

The three lens portions 100a, 100b, and 100c have circular spherical surface portions as shown in FIG. 5, which illustrates the objective lens 100 viewed from the side where light is projected. An infrared radiation cutting filter having a low transmission factor with respect to a wavelength range of 670 nm and greater is formed on the spherical surface portions, while a light shielding film is formed on the plane portion 100d shown with hatching. More specifically, the objective optical system is formed of the objective lens 100 and the diaphragm 110, while the three lens portions 100a, 100b, and 100c form the imaging system.

The solid-state image pickup element 120 is identical to the one in the first embodiment shown in FIG. 2. The image circles 51a and 51b overlap each other and the image circles 51b and 51c overlap each other.

In FIG. 18, thin plates 700a, 700b, and 700c arranged on the light incidence side of the diaphragm 110 are polarizing plates. As shown by arrows A, B, and C, the polarizing plates 700a and 700c are polarizing plates for transmitting light having an oscillation phase in the vertical direction of FIG. 18, while the polarizing plate 700b is a polarizing plate for transmitting light having an oscillation phase in an orthogonal direction (in the direction piercing the figure at right angles).

Figure 20:
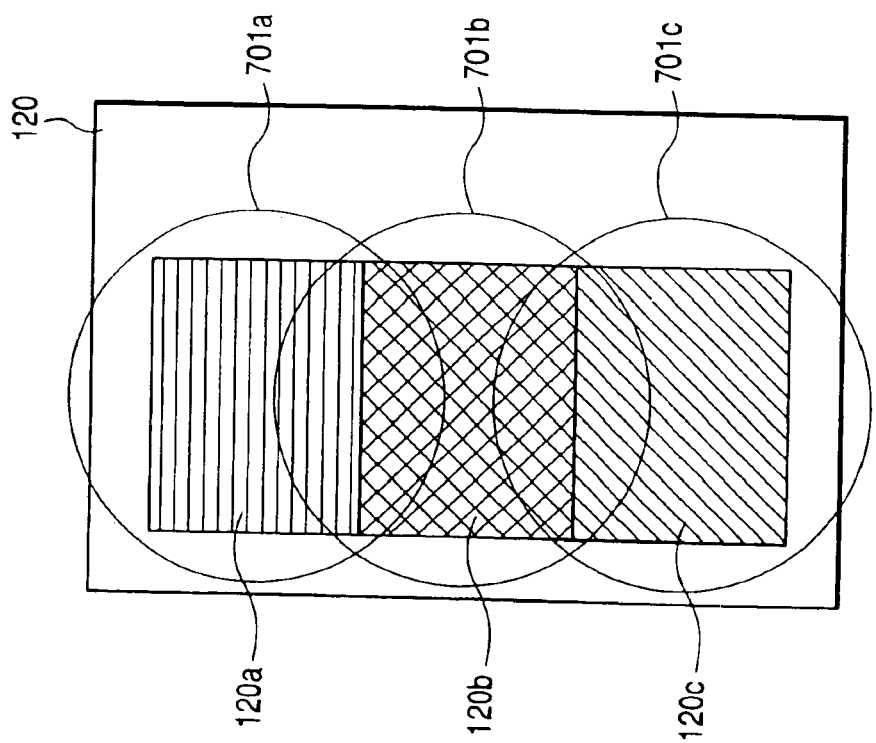
FIG. 20 is a front view of a solid-state image pickup element according to the second embodiment of the present invention.

Differently from the case of the first embodiment, since the optical filters for transmitting green, red, or blue light are not formed on the objective lens, an object image formed in an image circle 701a shown in FIG. 20 is a color image of linearly polarized light having an oscillation phase in the vertical direction in FIG. 18, an object image formed in an image circle 701b is a color image of linearly polarized light having an oscillation phase in the vertical direction with respect to the plane of FIG. 18, and an object image formed in an image circle 701c is a color image of linearly polarized light having an oscillation phase in the vertical direction in FIG. 18. In other words, these formed images are linearly polarized light images with their oscillation phases being orthogonal.

On the other hand, similarly to the case of the first embodiment, the optical filters 53a, 53b, and 53c are formed on the three image pickup regions 120a, 120b, and 120c, respectively, of the solid-state image pickup element 120. Their spectral transmission factor characteristics are equivalent to the ones shown in FIG. 6. Therefore, the image pickup regions 120a, 120b, and 120c are sensitive to green light (G), red light (R), and blue light (B), respectively.

Polarizing plates 702a, 702b, and 702c are arranged in front of the image pickup regions of the solid-state image pickup element 120. As shown by arrows D, E, and F, the polarizing plates 702a, 702b, and 702c have transmission axes aligned with those of the polarizing plates 700a, 700b, and 700c, respectively.

Since the amount of light received at the respective image pickup regions are given as the product of the spectral transmission factors of the pupils and the spectral transmission factors of the image pickup regions, respectively, the combination of the pupil and the image pickup region is selected according to the transmission axes of the polarizing plates. More specifically, object light which goes through the diaphragm opening 110a is mainly photoelectrically converted in the image pickup region 120a, object light which goes through the diaphragm opening 110b is mainly photoelectrically converted in the image pickup region 120b, and object light which goes through the diaphragm opening 110c is mainly photoelectrically converted in the image pickup region 120c. In other words, by the optical filters provided on the solid-state image pickup element 120, the image pickup regions 120a, 120b, and 120c output a G image, an R image, and a B image, respectively. In this way, in the image processing system 20, a color image is formed based on the photoelectric conversion output of one of the plurality of images obtained in the plurality of image pickup regions of the solid-state image pickup element 120, respectively. In this case, since the peak wavelength of the spectral luminous efficiency is 555 nm, the signal processing is carried out using a G image signal including this wavelength, as a reference image signal.

When the pixel pitch of the solid-state image pickup element is fixed, compared with a system adopted in a conventional digital color camera in which an RGB color filter is formed on the solid-state image pickup element with, for example, on 2×2 pixel basis to provide wavelength selectability to each of the pixels, and thereby an object image is separated into RGB images, the size of the object image is $1/\sqrt{3}$ times, and thus, the focal length of the objective lens is about $1/\sqrt{3}$ times. This is quite advantageous in making the camera thin.

Further, though complementary optical filters of cyan, magenta, and yellow having wide overlapping wavelength ranges can not be used in the first embodiment, where an image is photoelectrically converted selectively based on the spectrum of the object image, the present embodiment makes it possible to use such complementary optical filters, since an image is photoelectrically converted selectively based on the direction of oscillation of the light as described above, and thus the overlapping of the wavelength ranges becomes irrelevant. By using complementary optical filters, the light amount reaching the solid-state image pickup element can be increased compared with that when primary color filters are used.

In addition, in the case that an image is selected based on the direction of oscillation of the light, there is a degree of freedom in arranging the optical filters for the color separation. FIG. 19 illustrates another embodiment where the position of the optical filters are changed from those in the embodiment shown in FIG. 18. In an image pickup system 791 shown in FIG. 19, optical filters for the color separation are provided on the light incidence plane 100e, not on the solid-state image pickup element 720.

Figure 21:
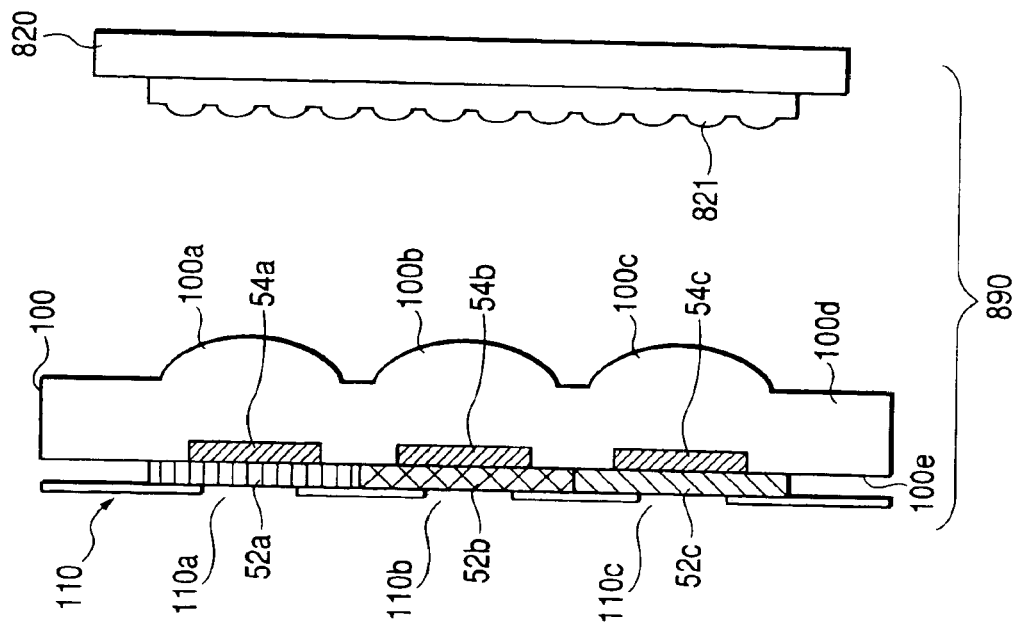
FIG. 21 is a sectional view of an image pickup system of a digital color camera according to a third embodiment of the present invention.

FIG. 21 is a sectional view showing a third embodiment of the image pickup system. The diaphragm 110 and the objective lens 100 of an image pickup system 890 are identical to the ones in the first embodiment.

Figure 22:
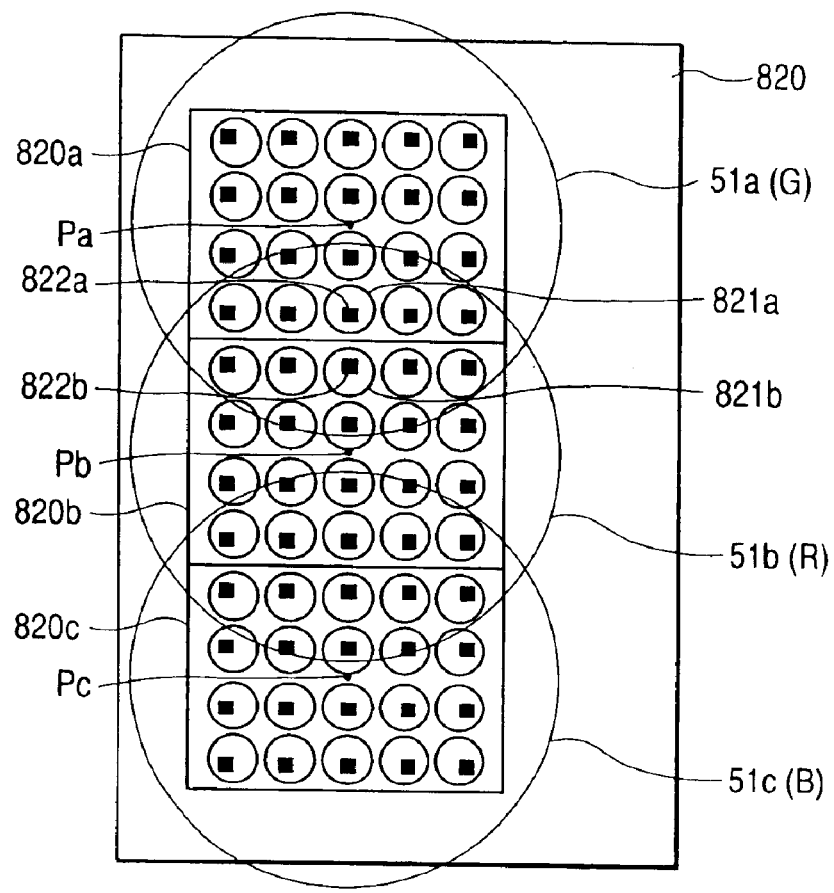
FIG. 22 is a front view of a solid-state image pickup element of the image pickup system shown in FIG. 21.

FIG. 22 is a front view of a solid-state image pickup element 820. Similarly to the case of the first embodiment shown in FIG. 2, the image circles 51a, 51b, and 51c are formed on the solid-state image pickup element 820. The image circles 51a and 51b overlap each other, and the image circles 51b and 51c overlap each other.

Differently from the case of the first embodiment, a microlens 821 is formed on image pickup regions 820a, 820b, and 820c with regard to light receiving portions (for example, 822a and 822b) of the respective pixels. Instead, optical filters for transmitting green light, red light, and blue light are not formed on the solid-state image pickup element 820. It is to be noted that, for the sake of clarity in explaining the microlens, the pixel shift among the image pickup regions is omitted in the illustration.

The microlens 821 is offset with respect to the light receiving portions of the solid-state image pickup element 820. The amount of offset is set so as to be zero at the centers of the respective image pickup regions 820a, 820b, and 820c, and so as to become larger toward the periphery. The direction of the offset is the direction of line segments connecting a center point Pa, Pb, or Pc of the image pickup regions 820a, 820b, or 820c and the light receiving portions, respectively.

Figure 23:
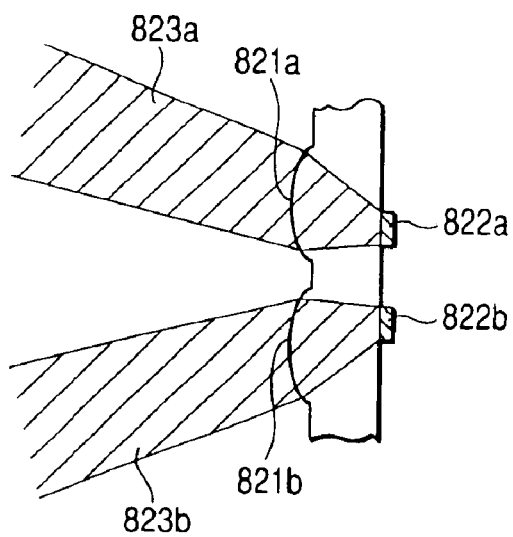
FIG. 23 is an explanatory view of the action of a microlens of the image pickup system shown in FIG. 21.

FIG. 23 is an explanatory view of the action of the microlens, and is a sectional view showing enlarged light receiving portions 822a and 822b at positions where the image pickup regions 820a and 820b are in contact with each other. A microlens 821a is offset upward in the figure with respect to the light receiving portion 822a, while a microlens 821b is offset downward in the figure with respect to the light receiving portion 822b. As a result, light flux entering the light receiving portion 822a is limited to a hatched region 823a, while light flux entering the light receiving portion 822b is limited to a hatched region 823b.

The direction of the inclination of the light flux region 823a, and the direction of the inclination of the light flux region 823b, are opposite to each other, and are toward the lens portions 100a and 100b, respectively. Accordingly, by selecting appropriately the amount of the offset of the microlens, light flux projected only from particular pupils enters the image pickup regions. More specifically, the amount of offset can be set such that object light which goes through the diaphragm opening 110c is mainly photoelectrically converted in the image pickup region 820a, object light which goes through the diaphragm opening 110b is mainly photoelectrically converted in the image pickup region 820b, and object light which goes through the diaphragm opening 110c is mainly photoelectrically converted in the image pickup region 820c. Since the optical filters 52a, 52b, and 52c are provided on the light incidence plane 100e of the objective lens 100, the image pickup regions 820a, 820b, and 820c output a G image, an R image, and a B image, respectively.

When the pixel pitch of the solid-state image pickup element is fixed, compared with a system adopted by a conventional digital color camera in which an RGB color filter is formed on the solid-state image pickup element with, for example, on 2×2 pixel basis to provide wavelength selectability to each of the pixels, and thereby an object image is separated into RGB images, the size of the object image is $1/\sqrt{3}$ times, and thus, the focal length of the objective lens is about $1/\sqrt{3}$ times. This is quite advantageous in making the camera thin.

Further, though complementary optical filters of cyan, magenta, and yellow having wide overlapping wavelength ranges can not be used in the first embodiment, where an image is photoelectrically converted selectively based on the spectrum of the object image, the present invention makes it possible to use such complementary optical filters, since an image is photoelectrically converted selectively by the offset of the microlens, as described above, and thus the overlapping of the wavelength ranges becomes irrelevant. By using complementary optical filters, the light amount reaching the solid-state image pickup element can be increased compared with that when primary color filters are used.

In addition, in the case that an image is selected by the offset of the microlens, the optical filters may be provided on the solid-state image pickup element 820 instead of providing them on the light incidence plane 100e of the objective lens 100. Regardless of the position of the optical filters, the present embodiment is quite advantageous from the viewpoint of the light amount compared with the optical path in the first embodiment which goes through two optical filters and the optical path in the second embodiment using polarizing plates. In addition, it is also possible to provide the optical filters both on the light incidence plane 100e of the objective lens 100 and on the solid-state image pickup element 820 to further decrease the cross-talk of images.

As described above, in the embodiments described above, by constructing an image pickup apparatus so as to have a plurality of image pickup regions, an imaging means for projecting an image of an object so that the image extends over one of the image pickup regions and another adjacent image pickup region, and a suppressing means for suppressing photoelectric conversion in the another image pickup region of an image signal from the subject input from the imaging means, the following technological advantages can be attained.

(1) A thin digital color camera can be provided using a small-sized image pickup element which does not require an object image separating wall.

(2) By forming object images of each of the wavelength ranges, pixels provided with the same kind of optical filters can be densely arranged, and an image pickup system can be materialized which does not require an optical low-pass filter for removing return aliasing.

Further, by using suppressing means which is formed with a first plurality of color filters of different wavelength ranges, provided on the plurality of imaging means, respectively, and a second plurality of color filters of the same wavelength ranges as those of the first plurality of color filters, provided in the image pickup regions, respectively, the following technological advantages can be obtained.

(3) A thin digital color camera can be provided using a small-sized image pickup element which is constructed to be appropriate for obtaining a high color purity image and which does not require an object image separating wall.

Still further, by using suppressing means which is formed with a first plurality of polarizing means which have different polarizing directions with regard to adjacent imaging means and which are provided correspondingly with the plurality of imaging means, respectively, and a second plurality of polarizing means of the same polarizing directions as those of the first plurality of polarizing means, which are provided correspondingly with the image pickup regions, respectively, the following technological advantages can be obtained.

(4) A thin digital color camera can be provided using a small-sized image pickup element which is constructed without putting limitations on the optical filters for the color separation and which does not require an object image separating wall.

(5) Using complementary optical filters can be made possible to materialize an image pickup system which is advantageous from the viewpoint of the required light amount.

The individual components shown in schematic or block form in the drawings are all well-known in the camera arts and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

For example, in the described embodiments, optical filters used for the color separation are primary color filters of red, green, and blue. However, the present invention is also applicable to a case where these filters are replaced by complementary color filters of cyan, magenta, and yellow.

Further, in the above embodiments, an object image having the highest luminosity factor (green) is used as a reference to describe change in the intervals between the object image having the highest luminosity factor and object images having other luminosity factors (other colors), which is caused by change in the distance to the object. However, the present invention is also applicable to a case where an object image other than the object image having the highest luminosity factor (green) is used as a reference.

It is to be noted that, in the present invention, the respective embodiments in the above or technical elements thereof may be freely combined depending on the situation.

Also, in the present invention, the whole or part of the appended claims or of the structure of an embodiment may form one apparatus, may be combined with another apparatus, or may be an element of an apparatus.

What is claimed is:

1. An image pickup apparatus comprising:

first and second image pickup portions for receiving at least a first wavelength component of an object light and a second wavelength component of the object light different from the first wavelength component, respectively;

first and second optical systems for projecting the object light onto said first and second image pickup portions, respectively, via different optical paths, said second optical system projecting the object light also onto said first image pickup portion; and guide path forming portions arranged correspondingly with said first and second image pickup portions, respectively, so that each of said guide path forming portions receives the object light including the first and second wavelength components and provides different guide paths thereto, respectively, so as to guide the wavelength component from the optical system corresponding to each of said guide path forming portions among the received first and second wavelength components onto the image pickup portion corresponding to each of said guide path forming portions, wherein, when a virtual object distance D (m) is defined as a function of an image pickup angle θ (°) of said first or second optical systems to be D=1.4/tan (θ/2), an interval between optical axes of said first and second optical systems is set such that change in an interval between an object image of the first wavelength component received by said first image pickup portion and an object image of the second wavelength component received by said second image pickup portion between when an object is at the virtual distance and when the object is at infinity is smaller than a pixel pitch of said image pickup portions multiplied by two.

2. An image pickup apparatus according to claim 1, wherein the first wavelength component is a representative wavelength of light of a first spectral distribution and the second wavelength component is a representative wavelength of light of a second spectral distribution which is different from the first spectral distribution.

3. An image pickup apparatus according to claim 2, wherein the first spectral distribution is a spectral distribution including a peak wavelength of a luminosity factor.

4. An image pickup apparatus according to claim 1, wherein the first wavelength component is included in a spectral distribution including a peak wavelength of a luminosity factor.

5. An image pickup apparatus according to claim 1, wherein the first and second wavelength components are two different color components among red, green, and blue.

6. An image pickup apparatus according to claim 1, wherein said first and second optical systems comprise a filter for extracting the first and second wavelength components, respectively.

7. An image pickup apparatus according to claim 1, wherein each of said first and second optical systems comprises a single lens.

8. An image pickup apparatus according to claim 7, wherein said single lenses of said first and second optical systems are integrally formed of a glass material or a resin material.

9. An image pickup apparatus according to claim 8, further comprising:
a light shielding layer provided between said integrally formed single lenses.

10. An image pickup apparatus according to claim 1, wherein each of said first and second optical systems comprises a single lens provided with an infrared radiation cutting filter.

11. An image pickup apparatus according to claim 1, wherein each of said first and second optical systems comprises photochromic glass.

12. An image pickup apparatus according to claim 1, wherein each of said first and second optical systems comprises a color purity correction filter.

13. An image pickup apparatus according to claim 1, wherein each of said first and second optical systems comprises a filter whose transmission factor becomes smaller as the distance from an optical axis thereof becomes longer.

14. An image pickup apparatus according to claim 1, wherein said first and second image pickup portions are integrally formed.

15. An image pickup apparatus according to claim 1, wherein said first and second image pickup portions are formed in a plane shape.

16. An image pickup apparatus according to claim 1, further comprising:
a plurality of openings for taking in external light through said first and second optical systems.

17. An image pickup apparatus comprising:
first and second image pickup portions for receiving at least a first wavelength component of an object light and a second wavelength component of the object light different from the first wavelength component, respectively;
first and second optical systems for protecting the object light onto said first and second image pickup portions, respectively, via different optical paths, said second optical system protecting the object light also onto said first image pickup portion; and
guide path forming portions arranged correspondingly with said first and second image pickup portions, respectively, so that each of said guide path forming portions receives the object light including the first and second wavelength components and provides different guide paths thereto, respectively, so as to guide the wavelength component from the optical system corresponding to each of said guide path forming portions among the received first and second wavelength components onto the image pickup portion corresponding to each of said guide path forming portions,
wherein said guide path forming portions comprise a first filter for extracting the first wavelength component and a second filter for extracting the first wavelength component which comes through said first filter.

18. An image pickup apparatus comprising:
first and second image pickup portions for receiving at least a first wavelength component of an object light and a second wavelength component of the object light different from the first wavelength component, respectively;
first and second optical systems for projecting the object light onto said first and second image pickup portions, respectively, via different optical paths, said second optical system projecting the object light also onto said first image pickup portion; and
guide path forming portions arranged correspondingly with said first and second image pickup portions, respectively, so that each of said guide path forming portions receives the object light including the first and second wavelength components and provides different guide paths thereto, respectively, so as to guide the wavelength component from the optical system corresponding to each of said guide path forming portions among the received first and second wavelength components onto the image pickup portion corresponding to each of said guide path forming portions,
wherein each of said guide path forming portions comprises a first polarizing filter for transmitting the object light received by said first image pickup portion and a second polarizing filter of a same polarizing direction as that of said first polarizing filter for transmitting the object light which comes through said first polarizing filter.

19. An image pickup apparatus comprising:
first and second image pickup portions for receiving at least a first wavelength component of an object light and a second wavelength component of the object light different from the first wavelength component, respectively;
first and second optical systems for projecting the object light onto said first and second image pickup portions, respectively, via different optical paths, said second optical system projecting the object light also onto said first image pickup portion; and
guide path forming portions arranged correspondingly with said first and second image pickup portions, respectively, so that each of said guide path forming portions receives the object light including the first and second wavelength components and provides different guide paths thereto, respectively, so as to guide the wavelength component from the optical system corresponding to each of said guide path forming portions among the received first and second wavelength components onto the image pickup portion corresponding to each of said guide path forming portions
wherein said guide path forming portions include a microlens for receiving the object light projected by said first optical system and guiding the object light to said first image pickup portion, said microlens receiving the object light projected by said second optical system onto said first image pickup portion and not guiding the object light to said first image pickup portion.

20. An image pickup apparatus comprising:
first and second image pickup portions for receiving at least a first wavelength component of an object light and a second wavelength component of the object light different from the first wavelength component, respectively;

first and second optical systems for projecting the object light onto said first and second image pickup portions, respectively, via different optical paths, said second optical system projecting the object light also onto said first image pickup portion; and guide path forming portions arranged correspondingly with said first and second image pickup portions, respectively, so that each of said guide path forming portions receives the object light including the first and second wavelength components and provides different guide paths thereto, respectively, so as to guide the wavelength component from the optical system corresponding to each of said guide path forming portions among the received first and second wavelength components onto the image pickup portion corresponding to each of said guide path forming portions, wherein said guide path forming portions include a micro lens for receiving the object light projected by said first optical system and guiding the object light to said first image pickup portion, said microlens being offset so as to receive the object light projected by said second optical system onto said second image pickup portion and not to guide the object light to said first image pickup portion.

* * * * *

UNITED STATES PATENT AND TRADEMARK OFFICE
CERTIFICATE OF CORRECTION

PATENT NO. : 6,980,248 B1
DATED : December 27, 2005
INVENTOR(S) : Yasuo Suda

It is certified that error appears in the above-identified patent and that said Letters Patent is hereby corrected as shown below:

Column 3,
Line 63, "10" should read -- 110 --.

Column 4,
Line 14, "10" should read -- 110 --.

Column 8,
Line 20, "00b" should read -- 100b --.
Line 38, "rom" should read -- mm --.

Column 11,
Line 16, "2.8 m" should read -- 2.8 μm --.
Lines 29 and 47, "as" should read -- αS --.

Column 13,
Line 61, "addresss" should read -- address --.

Signed and Sealed this

Thirtieth Day of May, 2006

JON W. DUDAS
*Director of the United States Patent and Trademark Office*